(12) United States Patent
van der Valk et al.

(10) Patent No.: US 7,642,862 B2
(45) Date of Patent: Jan. 5, 2010

(54) DIGITAL PHASE LOCKED LOOP

(75) Inventors: Robertus Laurentius van der Valk, Capelle aan den Ijssel (NL); Paul Hendricus Lodewijk Maria Schram, Bergen op Zoom (NL); Johannes Hermanus Aloysius de Rijk, Rotterdam (NL)

(73) Assignee: Zarlink Semiconductor Inc. (CA)

( * ) Notice: Subject to any disclaimer, the term of this patent is extended or adjusted under 35 U.S.C. 154(b) by 4 days.

(21) Appl. No.: 11/939,894

(22) Filed: Nov. 14, 2007

(65) Prior Publication Data
US 2008/0116982 A1    May 22, 2008

(30) Foreign Application Priority Data
Nov. 17, 2006    (GB)    ................. 0622948.8

(51) Int. Cl.
    *H03L 7/06*    (2006.01)
(52) U.S. Cl. .......................... 331/18; 331/25
(58) Field of Classification Search ............. 331/1 A, 331/8, 16–18, 25; 327/156–159; 332/127; 360/51; 375/376; 455/260
    See application file for complete search history.

(56) References Cited
U.S. PATENT DOCUMENTS

| | | | |
|---|---|---|---|
| 5,473,285 A | 12/1995 | Nuckolls et al. | |
| 5,727,038 A * | 3/1998 | May et al. | 375/376 |
| 6,532,271 B1 * | 3/2003 | Hwang et al. | 375/326 |
| 2003/0184394 A1 | 10/2003 | Lin et al. | |
| 2003/0234693 A1 | 12/2003 | Staszewski et al. | |
| 2005/0077969 A1 | 4/2005 | Lalt et al. | |
| 2006/0001464 A1 | 1/2006 | Yokozeki | |
| 2006/0056563 A1 | 3/2006 | Aweya et al. | |

FOREIGN PATENT DOCUMENTS

| | | |
|---|---|---|
| EP | 1 513 257 A3 | 3/2005 |
| EP | 1 584 929 A3 | 10/2006 |
| GB | 2 363 268 A | 12/2001 |
| WO | WO 98/04042 A1 | 1/1998 |

* cited by examiner

*Primary Examiner*—David Mis
(74) *Attorney, Agent, or Firm*—Lawrence E. Laubscher, Jr.

(57) ABSTRACT

A digital phase locked loop includes a phase acquisition unit for producing a digital representation of the phase of a reference signal, a digital phase detector having a first input receiving a digital signal from, or derived from, the output of the phase acquisition unit, digital loop filter filtering the output of the digital phase detector, and a digital controlled oscillator generating an output signal under the control of the digital loop filter. A digital feedback loop provides a second input to the digital phase detector from the output of the digital controlled oscillator.

2 Claims, 2 Drawing Sheets

DIGITAL PHASE LOCKED LOOP

FIELD OF THE INVENTION

This invention relates to a digital phase locked loop, and in particular to a digital phase locked loop (PLL) without a physical feedback signal.

BACKGROUND OF THE INVENTION

In the design of a PLL a critical issue is the design of the phase detector as it includes a number of factors that limit performance of the PLL. A conventional analog PLL typically is constructed as shown in FIG. 1. In this Figure a phase detector determines the difference between two phase signals, one being the feedback signal and the other being the reference signal. The output of the phase detector is fed to a filter section, which may for instance be P type only (Proportional) but typically will be PI type (Proportional-Integral), providing a so-called type II PLL. The filter feeds to a controlled oscillator, which in FIG. 1 is a voltage or current controlled oscillator. The frequency generated by the controlled oscillator is divided and fed back to the input of the phase The analysis of such a Phase Locked Loop or PLL is typically done using Black's formula to analyze bandwidth of the closed loop, overshoot, peaking and the like.

Analog PLL's have several limitations for which digital PLLs have a much better performance. This results from the different nature of digital PLL. In a digital PLL the phase signal is sampled and used to control a digitally controlled oscillator or DCO. Digital PLLs have several advantages including simple and accurate holdover. If there is no reference signal available a digital PLL can use its current or an historic DCO setting to maintain the same output frequency without any error in the digital control value. A digital PLL will typically rely on stability of its clock signal to achieve this, which mostly will come from a crystal oscillator. Analog PLLs will have other, less stable elements in their structure to rely upon.

A digital PLL will have no difficulty providing extreme bandwidths in the order of 10 MHz, which is very difficult for analog PLLs. A digital PLL relies on the stability of its clock.

A digital PLL can handle extremely low input frequencies such as 1 Hz. An analog PLL will introduce a lot of noise of the phase detector, charge pump and the like, as all noise of the analog elements will be folded back into a small frequency band. The noise of the crystal of a digital PLL will also be folded back, but remain much lower in absolute size. A typical digital PLL looks a lot like an analog PLL and is shown in FIG. 2. A sampling unit supplies the input to the phase detector which in turn supplies the signal to the digital filter, the DCO and frequency synthesizer. However, digital PLLs are susceptible to the additional of noise that is added to the feedback signal during the re-sampling process.

Examples of typical prior art circuits are shown in U.S. Pat. Nos. 5,602,884; 7,006,590; and 5,905,388.

SUMMARY OF THE INVENTION

According to a first aspect of the invention there is provided a digital phase locked loop comprising a phase acquisition unit for producing a digital representation of the phase of a reference signal; a digital phase detector having a first input receiving a digital signal from, or derived from, the output of the phase acquisition unit; a digital loop filter filtering the output of the digital phase detector; a digital controlled oscillator generating an output signal under the control of the digital loop filter; and a digital feedback loop providing a second input to the digital phase detector from the output of the digital controlled oscillator.

According to another aspect the invention provides a method of tracking a reference signal comprising producing a digital representation of the phase of the reference signal; generating an output signal with a digital controlled oscillator; and comparing the digital phase of the output of the digital controlled oscillator with the digital representation of the reference signal to produce a control signal for the digital controlled oscillator.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
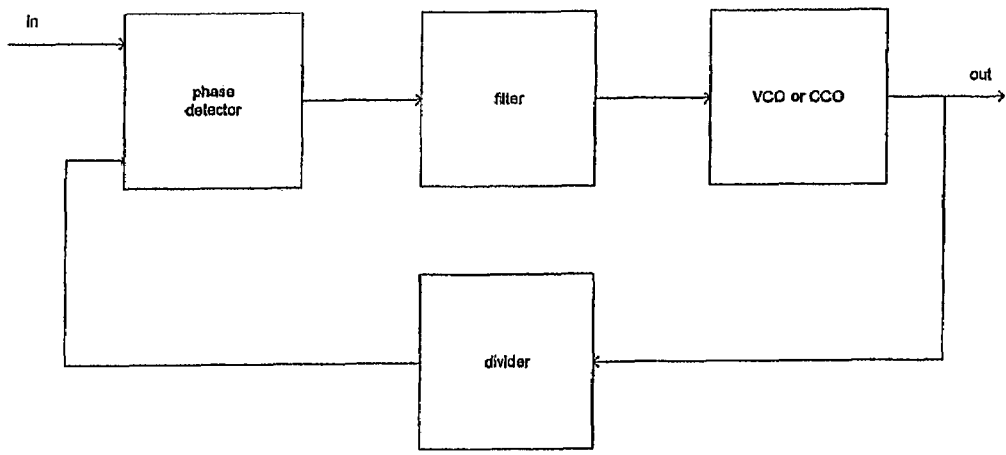
FIG. 1 is a block diagram of a conventional analog PLL.
Figure 2:
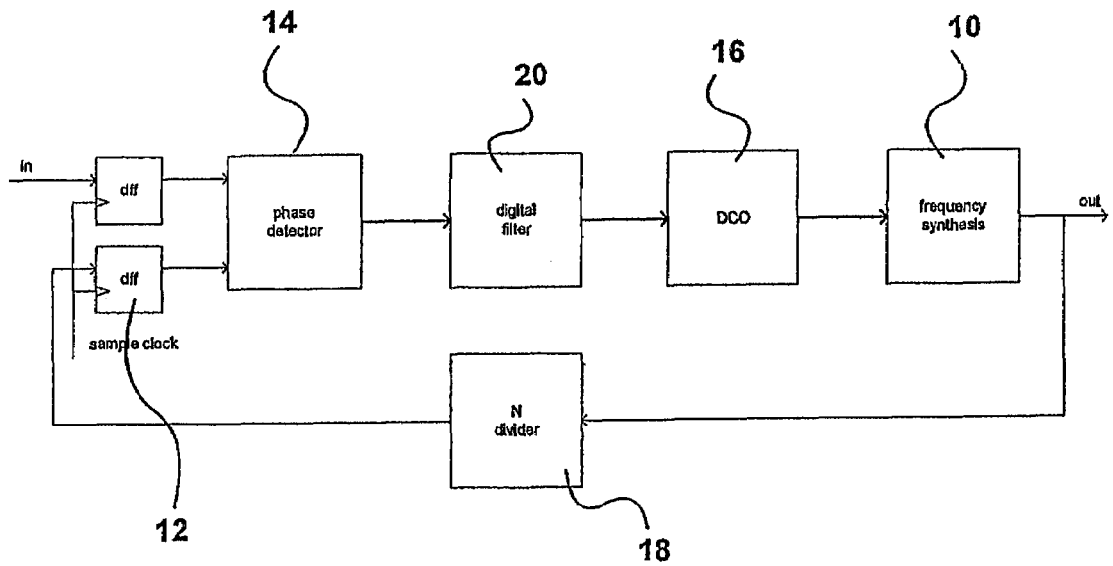
FIG. 2 is a block diagram of a conventional digital PLL block diagram.

Referring again to FIG. 2, the output of the frequency synthesizer 10 is passed through sampling unit D-type flip flops 12 to an input of the phase detector 14, which is a detector with negative and positive inputs. It will be observed that the feedback signal from the frequency synthesizer 10 is actually a close derivative of the output of the DCO 16.

It is thus possible to generate the phase feedback signal not as a real frequency but as a digital word by taking the DCO phase (frequency) value and multiplying/dividing it to map it to another phase (frequency) in a straightforward mathematical operation: multiplication with a (fractional) number which is identical with division by a fractional number. If that is done, the phase comparison at the input of the PLL must be performed with a signal from a block that acquires the phase of the input signal and compares that with the feedback phase word.

The sampling of a real feedback signal actually does not yield information, but at best may add noise. The generation from DCO of a real signal goes from the domain of a digital word to a real physical signal, and is sampled back into the digital domain at which moment the signal is a digital word again. In reality the two domain transitions are normally designed to make the noise errors as small as possible. In accordance with embodiments of the invention, the two domain transitions are eliminated altogether, which makes the design of the circuit simpler, since the two transitions no longer introduce difficult design problems. Instead, the process is performed entirely in the digital realm, where many operations are simple to implement without any error.

Figure 3:
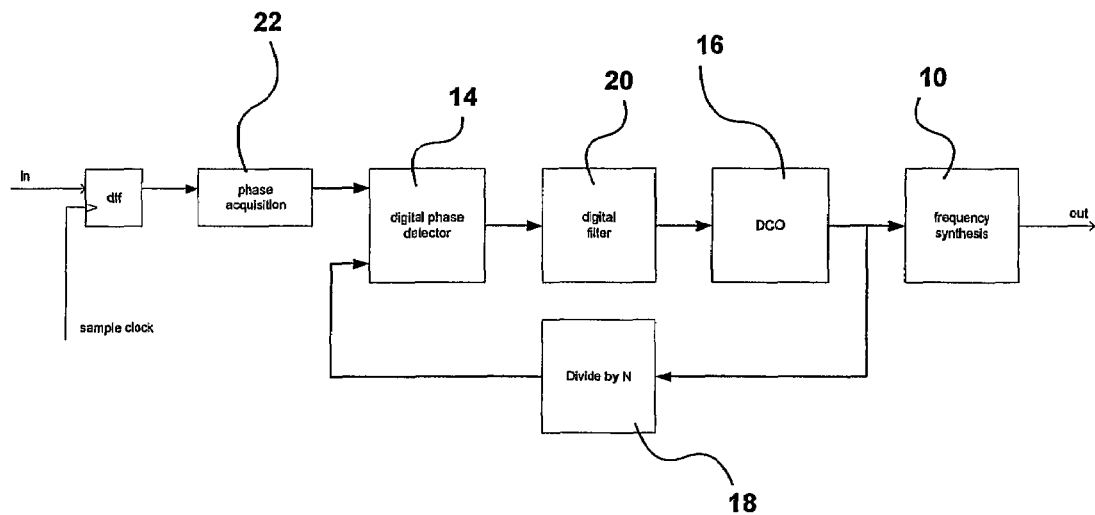
FIG. 3 is a block diagram of a digital PLL with phase acquisition and all digital loop.

FIG. 3 shows an all digital PLL. The digital phase detector 14, divide-by-N unit 18, digital filter 20, and DCO 16 can all be readily implemented in hardware or software or a combination thereof so that any design can be well optimized for testability, speed, flexibility and the like.

The design of the real loop mathematics has been described in numerous control theory papers and is not a source of major design difficulties. See, for example, Phase-locked loops: a control centric tutorial; Abramovitch, D. American Control Conference, 2002; page(s): 1-15 vol. 1; ISSN: 0743-1619, the contents of which are herein incorporated by reference.

Since the PLL of FIG. 3 is now implemented entirely in the digital domain, the problems noted above can be avoided. The lack of physical feedback offers more design flexibility and eliminates a number of blocks necessary implement domain transitions. This implies less real estate on the chip, power, and design efforts, and, mainly due to the overall power reduction (decreased supply coupling problems), somewhat improved performance for the remaining blocks.

A problem however is the implementation of the phase acquisition block 22 in such an environment. The operation of the phase acquisition block 22 is actually quite simple, and depends entirely on the correlation of the sample clock and the system clock on which all regular digital circuits run. The operation of the phase acquisition block will now be described in different scenarios.

1. Assume the two clocks are identical. In this case, at each sample clock where an input edge is detected, the associated divided DCO phase is known. The input phase can be expressed as a counted value, that is in terms of the number of clock pulse edges that have passed since reset. It then becomes trivial to take the input phase and subtract the divided DCO value in order to yield the phase difference expressed in terms of a number of input cycles.

2. Assume the sample clock is synchronous with the system clock, but, for instance, operating at a frequency 10 times higher. This can be attractive in order to have as little circuitry as possible at a high clock speed, to save power. If an input edge arrives, the sample edge on which is detected is equivalent again on a system clock cycle, but now with a single decimal point. So instead of detecting an edge on system cycle 3, it is possible to detect an input at system cycle 2.7, for example, which would be equivalent to sample cycle 27. Although the digital system does not directly generate the DCO value at that moment, it is a straightforward mathematical operation to interpolate the values to find the phase of input and divided DCO at the same moment in time. The interpolation is possible for the DCO, but also for the reference. Thus the phases of both signals at a specific moment are known, and the phase difference can be calculated.

3. Assume the sample clock is not synchronous with the system clock, but is running at a higher frequency and shifted over a (dynamic) part of a sample clock cycle. With the last example in mind it is simple to observe that expansion of the decimals is a simple task. In the previous example we expanded the detection edge to system cycle 2.7, which now for instance might become 2.71 when shifting over a 0.1 sample cycle. This mathematically is a simple operation.

For each edge it is a simple matter to compare (subtract) the phase of a single edge of the reference and the numerical feedback signal. It is also simple to perform this for many edges, with or without decimation. If decimation is applied, the numerical loop can be more easily implemented in software, which expands the flexibility. This yields the block diagram as in FIG. 4. Of course, decimation is a simple function and may also be implemented for low frequency signals in software.

Figure 4:
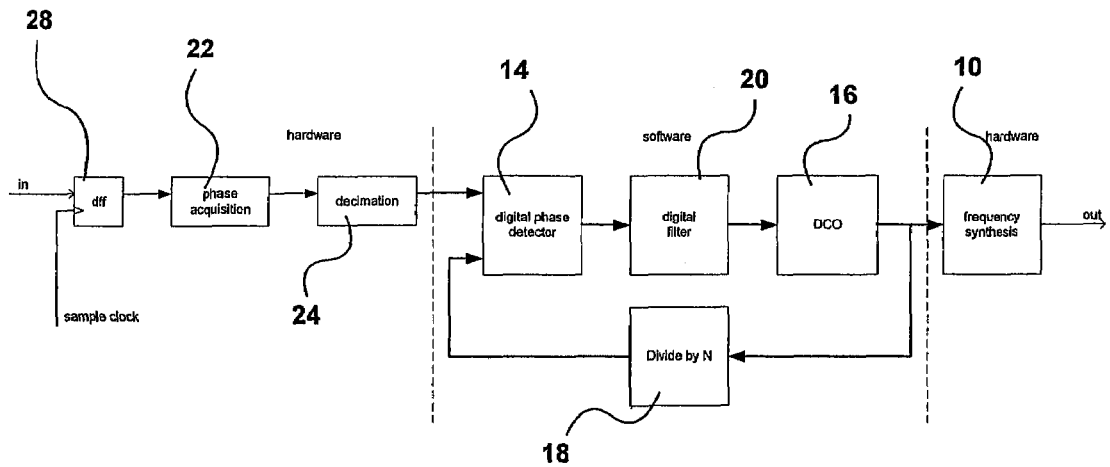
FIG. 4 is a block diagram of digital PLL with a numerical loop implemented in software.

In FIG. 4, the block 30 comprising the digital phase detector 14, the digital filter 20, the DCO 16, and the divide-by-N unit 18, is implemented in software. The frequency synthesizer is implemented in hardware. The input block including the difference unit 28, phase acquisition unit 22, and decimator 24 is implemented in hardware.

FIG. 4 includes a number of elements that are of interest for the increased performance. However, the accuracy of the value on the phase acquisition will always have limited accuracy, as the sampling process introduces a quantization error. The decimation unit may or may not decrease that error, depending on the correlation between sampling clock and sampled signal, but there always will be an error that enters the phase detector.

Dithering techniques can be employed to improve the quantization noise of the sample point.

At the same time, the DCO 16 may carry sufficient bits that its phase error can be stated to be effectively 0 under all conditions, thus giving the potential of a very fine resolution. The subtraction in the phase detector of the feedback signal could thus give the phase error a very fine resolution. Unfortunately, the error propagation from the sampled signal side will then determine the final resolution of the phase subtraction that the phase detector actually performs. Thus it may be necessary to perform rounding either on feedback signal or on phase difference, to represent the correct size of error.

The invention claimed is:

1. A digital phase locked loop comprising:
   a phase acquisition unit for producing a digital representation of the phase of a reference signal;
   a digital phase detector having a first input receiving a digital signal from, or derived from, the output of the phase acquisition unit;
   a digital loop filter filtering the output of the digital phase detector;
   a digital controlled oscillator generating an output signal under the control of the digital loop filter;
   a digital feedback loop including a divide-by-N unit providing a second input to the digital phase detector from the output of the digital controlled oscillator;
   a decimator for decimating the output of the phase acquisition unit for input to the digital phase detector; and
   wherein the digital phase detector, the digital filter, the digital controlled oscillator are implemented in software, and the phase acquisition unit and decimator are implemented in hardware.

2. A method of tracking a reference signal comprising:
   sampling the reference signal to produce a digital representation thereof;
   decimating said digital representation;
   generating an output signal with a digital controlled oscillator;
   comparing the digital phase of the output of the digital controlled oscillator with the decimated digital representation of the reference signal to produce a control signal for the digital controlled oscillator; and
   wherein the comparing step and the generating step are performed in software and the sampling step and the decimating step are performed in hardware.

* * * * *